United States Patent [19]

Cory

[11] Patent Number: 5,260,655
[45] Date of Patent: Nov. 9, 1993

[54] METHOD FOR IMPROVING THE RESOLUTION OF SOLID-STATE NMR MULTIPLE-PULSE IMAGING SYSTEMS USING SECOND AVERAGING

[75] Inventor: David G. Cory, Boston, Mass.

[73] Assignee: Bruker Instruments, Inc., Billerica, Mass.

[21] Appl. No.: 860,847

[22] Filed: Mar. 31, 1992

[51] Int. Cl.$^5$ .............................................. G01R 33/20
[52] U.S. Cl. ...................................... 324/309; 324/307
[58] Field of Search ............... 324/300, 307, 309, 310, 324/311, 312, 313, 314, 318, 322; 128/653.2, 653.5

[56] References Cited

U.S. PATENT DOCUMENTS 4,654,593 3/1987 Ackerman ........................... 324/307
4,833,411 5/1989 McDonald et al. ................. 324/309

OTHER PUBLICATIONS

"Time-Suspension Multiple-Pulse Sequences: Applications to Solid-State Imaging", D. G. Cory, J. B. Miller and A. N. Garroway Journal of Magnetic Resonance, vol. 90, pp. 205-213 (1990).
"Multiple-Pulse Methods of 1H N.M.R. Imaging of Solids: Second Averaging", D. G. Cory, J. B. Miller, R. Turner and A. N. Garroway, Molecular Physics, vol. 70, No. 2, pp. 331-345 (1990).

Primary Examiner—Michael J. Tokar
Attorney, Agent, or Firm—Cesari and McKenna

[57] ABSTRACT

In an NMR solid-state imaging experiment, second averaging is carried out during the experiment to reduce the effects of unwanted interactions that obscure the results of an interaction of interest. The second averaging is arranged so that the second averaging interaction and the interaction of interest are along the same axis, but are separated in time. The second averaging interaction is further designed to introduce a multiple of $\pi/2$ phase offset between applications of the interaction of interest. In this way, even when the sum of the actual resonance frequency and the second averaging frequency are zero, the spin dynamics are still modulated and a second averaging takes place.

An additional advantage is provided in that the resonance frequency can be sampled in such a fashion that the second averaging frequency does not appear in the observed resonance frequency.

18 Claims, 5 Drawing Sheets

METHOD FOR IMPROVING THE RESOLUTION OF SOLID-STATE NMR MULTIPLE-PULSE IMAGING SYSTEMS USING SECOND AVERAGING

FIELD OF THE INVENTION

This invention relates to NMR spectroscopy and NMR imaging and, in particular, to methods of second averaging which improve the resolution of solid-state NMR imaging systems when employed in combination with multiple-pulse coherent averaging methods.

BACKGROUND OF THE INVENTION

Many atomic nuclei possess a magnetic moment. Nuclear magnetic resonance (NMR) is a phenomenon exhibited by this select group of atomic nuclei (termed "NMR active" nuclei), which results from the interaction of the nuclei with an applied, external magnetic field.

The magnetic properties of a nucleus are conveniently discussed in terms of two quantities: the magnetogyric ratio (denoted by the symbol $\gamma$); and the nuclear spin (denoted by the symbol I). When an NMR active nucleus is placed in a magnetic field, its nuclear magnetic energy levels are split into $(2I+1)$ non-degenerate energy levels, and these levels are separated from each other by a characteristic energy that is directly proportional to the strength of the applied magnetic field. This phenomenon is called "Zeeman" splitting and the characteristic energy is equal to $\gamma h H_o / 2\pi$, where h is Plank's constant and $H_o$ is the strength of the magnetic field. The frequency corresponding to the energy of the Zeeman splitting ($\omega_o = \gamma H_o$) is called the "Larmor frequency" or "resonance" frequency. Typical NMR active nuclei include $^1H$ (protons), $^{13}C$, $^{19}F$, and $^{31}P$ nuclei. For these four nuclei, the nuclear spin $I=\frac{1}{2}$, and, accordingly, each nucleus has two nuclear magnetic energy levels.

When a bulk material sample containing NMR active nuclei is placed within a magnetic field, the nuclear spins distribute themselves amongst the nuclear magnetic energy levels in a known manner in accordance with Boltzmann's statics. This distribution results in a population imbalance between the energy levels and a net nuclear magnetization. It is this net nuclear magnetization that is studied by NMR techniques At equilibrium, the net nuclear magnetization is aligned with the external magnetic field and is time-independent. A second magnetic field perpendicular to the first magnetic field and rotating at, or near, the Larmor frequency can also be applied to the nuclei and this second field disturbs the equilibrium and induces a coherent motion (a "nutation") of the net nuclear magnetization. Since, at conventional magnetic field strengths, the Larmor frequency of typical NMR active nuclei is in the megahertz range, this second field is called a "radio-frequency field" (RF field). The effect of the RF field is to rotate the spin magnetization about the direction of the applied RF field. The time duration of the applied RF field determines the angle through which the spin magnetization nutates and, by convention, an RF pulse of sufficient length to nutate the nuclear magnetization through an angle of 90° or $\pi/2$ radians, is called a "$\pi/2$ pulse".

A $\pi/2$ pulse applied at a frequency near the resonance frequency will rotate a spin magnetization that was aligned along the external magnetic field direction in equilibrium into a plane perpendicular to the external magnetic field. The component of the net magnetization that is transverse to the external magnetic field then precesses about the external magnetic field at the Larmor frequency. This precession can be detected with a resonant coil located with respect to the sample such that the precessing magnetization induces a voltage across the coil. Frequently, the "transmitter" coil employed to apply the RF field to the sample and cause the spin magnetization to nutate and the "receiver" coil employed to detect the resulting precessing magnetization are one and the same coil. This coil is generally part of an NMR probe.

In addition to precessing at the Larmor frequency, the magnetization induced by the applied RF field changes and reverts to the equilibrium condition over time as determined by two relaxation processes: (1) dephasing within the transverse plane ("spin-spin relaxation") with an associated relaxation time, $T_2$, and (2) a return to the equilibrium population of the nuclear magnetic energy levels ("spin-lattice relaxation") with an associated relaxation time, $T_1$.

In order to use the NMR phenomenon to obtain an image of a sample, a magnetic field is applied to the sample, along with a magnetic field gradient which depends on physical position so that the field strength at different sample locations differs. When a field gradient is introduced, as previously mentioned, since the Larmor frequency for a particular nuclear type is proportional to the applied field, the Larmor frequencies of the same nuclear type will vary across the sample and the frequency variance will depend on physical position. By suitably shaping the applied magnetic field and processing the resulting NMR signals for a single nuclear type, a nuclear spin density image of the sample can be developed.

When an external magnetic field is applied to a nuclei in a chemical sample, the nuclear magnetic moments of the nuclei each experience a magnetic field that is reduced from the applied field due to a screening effect from the surrounding electron cloud. This screening results in a slight shift of the Larmor frequency for each nucleus (called the "chemical shift" since the size and symmetry of the shielding is dependent on the chemical composition of the sample).

In addition to the applied external magnetic field, each nucleus is also subject to local magnetic fields such as those generated by other nuclear and electron magnetic moments associated with nuclei and electrons located nearby. Interaction between these magnetic moments are called "couplings", and one important example of such couplings is the "dipolar" coupling. When the couplings are between nuclei of like kind, they are called "homo-nuclear couplings". In solids, the NMR spectra of spin=$\frac{1}{2}$ nuclei are often dominated by dipolar couplings, and in particular by dipolar couplings with adjacent protons. These interactions affect imaging by broadening the natural resonance linewidth and thereby reducing the image resolution.

In order to reduce the effect of such couplings, a class of experiments employs multiple-pulse coherent averaging to continuously modulate the internal Hamiltonians such that, in an interaction frame, selected Hamiltonians are scaled. A subclass of such experiments is designed to reduce the effects of homo-nuclear dipolar couplings by averaging the dipolar Hamiltonian to zero over a selected time period in this interaction frame. The most widely used group of these latter experiments consists of long trains of RF pulses applied in quadrature. Data is sampled between groups of pulses.

Multiple-pulse coherent averaging requires that the spin Hamiltonian be toggled through a series of predetermined states, the average of which has the desired property that the dipolar interaction appears to vanish. If an additional requirement is satisfied that the final Hamiltonian state of the series is equivalent to the first Hamiltonian state of the series, the process can be repeated and the temporal response of the sample can be mapped out successively, point-by-point.

The effects of undesirable interactions can be further reduced by a known technique called "second averaging". Consider an undesirable interaction which has an average direction, $\hat{\Omega}_u$, and a magnitude, $\omega_u$, in the toggling frame of the RF pulses. The average Hamiltonian for this undesired interaction is then:

$$\overline{H}_u = \omega_u \hat{\Omega}_u \tag{1}$$

The rotation average Hamiltonian may similarly be written as:

$$\overline{H}_r = \omega_r \hat{\Omega}_r \tag{2}$$

Though the principles of second averaging may be applied more generally, here only the case where $\hat{\Omega}_r \perp \hat{\Omega}_u$ and $\omega_r >> \omega_u$ is considered.

The spin system evolves or rotates about the sum of the two average Hamiltonians, $\overline{H}_u$ and $\overline{H}_r$. Since $\overline{H}_r$ is the larger of the two, the analysis can be simplified by transforming the system to a frame which rotates with $\overline{H}_r$ and examining the averaging of $\overline{H}_u$ in this second frame (this double transform is the reason for the name "second averaging"). It is, of course, necessary to transform back to the conventional toggling frame to discover the results of this experiment.

When this latter transformation is made, the averaging follows along the same lines as transforming into the toggling frame, with the second averaged Hamiltonian, $\overline{\overline{H}}_u$, being given by $$\overline{\overline{H}}_u^{(0)} = \frac{1}{\tau'_c} \int_0^{\tau'_c} H_u^{(0)}(t') dt' \tag{3}$$

where $$H_u^{(0)}(t) = U_r^{-1}(t) H_u^{(0)} U_r(t) \tag{4}$$

$$U_r(t) = T\exp\left\{-i \int_0^{\tau'_c} H_r^{(0)}(t') dt'\right\} \tag{5}$$

and $$\tau'_c = \text{cycle time for second averaging} \tag{6}$$
$$= \frac{2\pi}{\omega_r}$$

For the case of interest, the Hamiltonian in the frame of second averaging is $$H_u^{(0)}(t) = \omega_u \cos(\omega_r t)\Omega_u + \omega_u \sin(\omega_r t)[\Omega_u \times \Omega_r] \tag{7}$$

and the second averaged Hamiltonian is, $$H_u^{(0)}(t) = \omega_u \frac{\omega_r}{2\pi} \int_0^{2\pi/\omega_r} dt' \{\cos(\omega_r t')\hat{\Omega}_u + \sin(\omega_r t')[\hat{\Omega}_u \times \hat{\Omega}_r]\} \tag{8}$$

which vanishes over time. Consequently, the undesired interaction is averaged to zero.

Since the Hamiltonian in the second averaging frame is zero, when it is transformed back to the original observation frame (or toggling frame) the averaged Hamiltonian will acquire a rotational frequency of $\omega_r$ (i.e. the second-averaging frequency). Consequently, the second averaging interaction averages those interaction which are orthogonal to it and at relatively low frequency.

Although second averaging can be used to time average an undesired interaction to zero, there are two problems associated with the technique. First, the line-narrowing efficiency of the technique depends on the sum of the second averaging frequency and the frequency of the interaction of interest (the two of which may be one and the same frequency). The second problem is that the observed resonance frequency is offset by the second averaging frequency. It is also necessary that the interaction of interest be aligned with the second averaging rotation axis since the second averaging technique tends to average interactions which are orthogonal.

Second averaging is of particular interest in certain solid-state imaging experiments, for example, pulsed gradient NMR imaging experiments. In these experiments, the interaction of interest is the gradient induced spin evolution. Since this interaction is produced by the presence of an external field (the gradient field), it may be made time-dependent in all reference frames by modulating the magnetic field over time.

In such solid state imaging experiments, a major problem, as discussed above, is dipolar coupling which broadens the resonance line and, therefore, reduces image resolution. In order to reduce dipolar coupling, it is common in solid-state imaging experiments, to utilize any one of a number of well-known multiple-pulse RF pulse sequences, the effect of which is to time average the dipolar coupling to zero and thereby reduce the line width.

When these prior art pulse sequences are used, they tend to interact with the gradient evolution so that the line width, and therefore, the image resolution, becomes dependent on the gradient strength. This dependency introduces a spatial variation in the resolution so that the images of an object have higher resolution in the center than at the edges of the object. This latter effect is well-known in solid-state imaging.

However, it has been found that the gradient interaction may be decoupled from the line-narrowing efficiency of the multiple-pulse RF pulse cycles by using a pulsed gradient and carefully intercalating the gradient pulses between selected subcycles of the RF pulse cycle. This technique is described in detail in my co-pending application entitled "Method for Improving the Resolution of Solid-State NMR Multiple-pulse Imaging Systems", filed on an even date herewith and assigned to the same assignee as the present invention. The disclosure of that application is hereby incorporated by reference.

In particular, the aforementioned application discloses the use of conventional "time-suspension" multipulse RF pulse cycles that time average all interactions in an interaction frame in order to perform line narrowing. The gradient pulses are intercalated into the RF pulse sequence in such a manner that the gradient interaction is decoupled from the RF pulse interaction. Depending on the exact relation between the gradient pulses and the RF pulse sequence, the zero order term, the odd terms and the even terms to second order in the Magnus expansion of the dipolar Hamiltonian can be averaged to zero. When this latter technique is used with the time-suspension RF pulse sequences previously mentioned, the result is obtained that only the gradient interaction is observed in the final result.

It has been found that, further problems remain even with the use of such a decoupling technique. More particularly, when the gradient interaction is near zero, there are a number of undesired interactions associated with imperfections in the experimental realization that dominate the spin dynamics resulting in a false linewidth and resonance frequency. This false line width, in turn, decreases overall resolution. Consequently, an attempt has been made to introduce a second averaging interaction along the same axis as the interaction of interest such that the gradient evolution is not averaged to zero, but these other undesired interactions are averaged to zero in the manner discussed above.

Unfortunately, it has been found that the effect of such a course of action is simply to offset the observed resonance by the second averaging frequency such that the error terms caused by the same undesired interactions are now introduced at the point where the true resonance frequency and the second averaging frequency add up to zero. Consequently, the prior art second averaging technique ends up in shifting the point of reduced line-narrowing efficiency from zero, but it does not eliminate the error terms.

Accordingly, it is an object of the present invention to provide a method for operating a solid-state NMR imaging system so that the resulting images have uniform resolution over the entire image.

It is another object of the present invention to provide a method for operating a solid-state NMR imaging system in which line-narrowing can be carried out without introducing an inhomogeneity in the overall spatial resolution.

It is another object of the present invention to provide a method for operating a solid-state NMR imaging system in which the spatial dependency of the average dipolar Hamiltonian which results from line-narrowing is largely eliminated.

It is still another object of the present invention to provide a method for operating a solid-state NMR imaging system in which the spatial resolution is uniform and which method can be used with a variety of conventional line-narrowing RF pulse sequences.

It is a further object of the present invention to provide a method for operating a solid-state NMR imaging system in which second averaging can be carried out at all frequencies.

It is still a further object of the present invention to provide a method for operating a solid-state NMR imaging system in which second averaging can be carried out and in which the data can be sampled in such a manner that the second averaging frequency is not observed.

SUMMARY OF THE INVENTION

The foregoing objects are achieved and the foregoing problems are solved in one illustrative embodiment of the invention in which the second averaging interaction and the interaction of interest are along the same axis, so that the interaction of interest is not averaged by the second averaging interaction. The two interactions are separated in time, by insuring that both interactions occur for limited times which do not overlap. In this way, even when the sum of the actual resonance frequency and the second averaging frequency are zero, the spin dynamics are still modulated and a second averaging takes place. In cases where the second averaging interaction introduces an unacceptable frequency offset, the second averaging can be further designed to introduce a multiple of $\pi/2$ phase offset between applications of the interaction of interest. In this manner, the resulting data can be sampled in quadrature and the second averaging frequency eliminated from the data.

DETAILED DESCRIPTION OF A PREFERRED EMBODIMENT

Figure 1A:
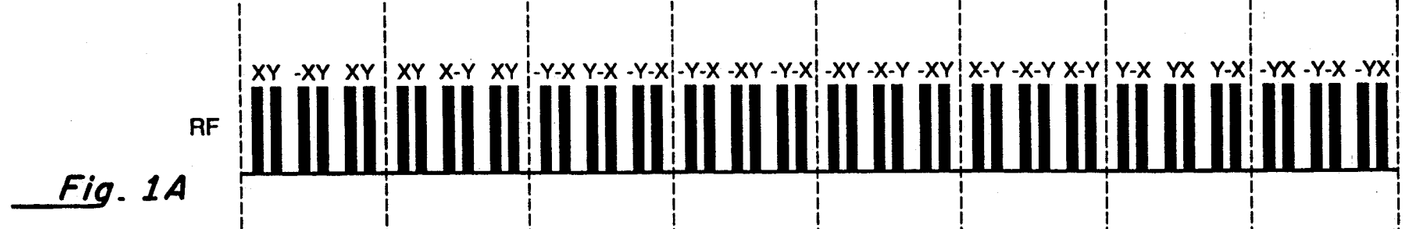
FIGS. 1A-1B are graphs of a solid-state imaging experiment which illustrates a line-narrowing RF pulse sequence used together with a pulsed gradient to decouple the gradient evolution from line-narrowing.
Figure 1B:
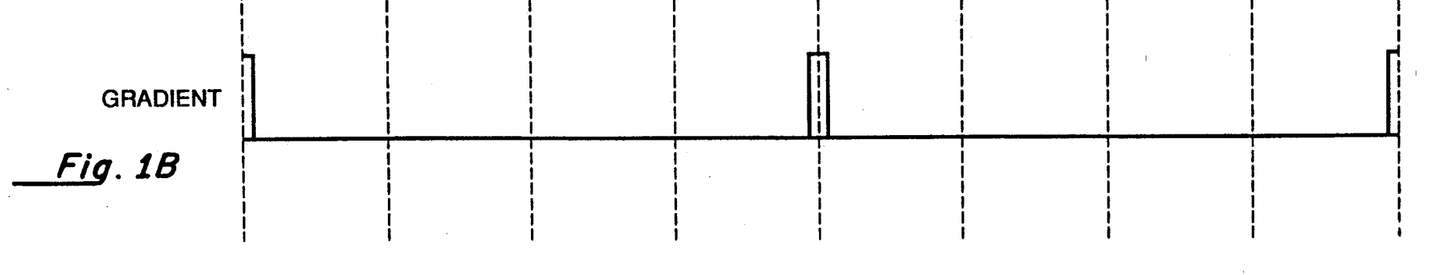

FIGS. 1A and 1B schematically illustrate a solid state imaging experiment utilizing a 48 RF pulse "time suspension" line narrowing sequence. This sequence has the property that it temporally averages both linear and bi-linear $I_z$ Hamiltonians to zero. The sequence is composed of eight composite inversion pulses 100-114. This experiment is designed in accordance with the invention disclosed in my aforementioned co-pending application entitled "Method for Improving the Resolution of Solid-State NMR Multiple-pulse Imaging Systems" in order to decouple the gradient interaction from the line-narrowing interaction.

Figure 2:
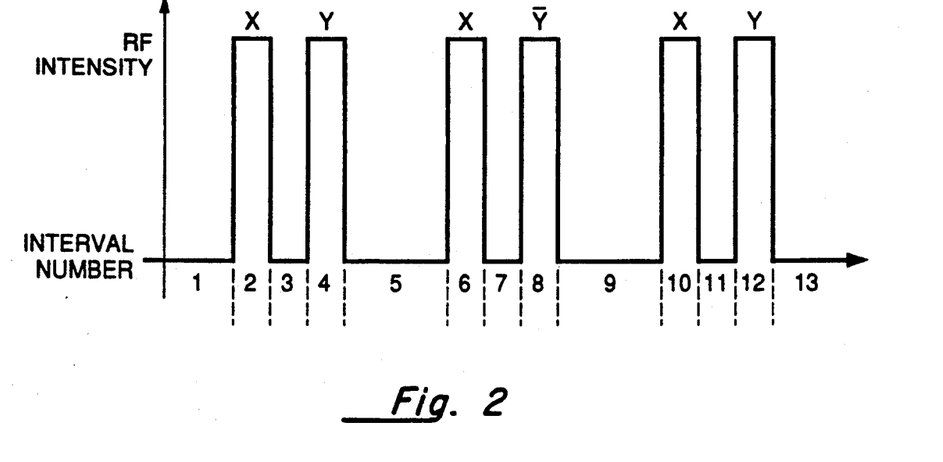
FIG. 2 is a schematic illustration of a known six-pulse dipolar decoupled inversion pulse with the various time intervals denoted.

Composite pulses and their characteristics are known in the art and are composed of a six RF pulse sequence shown in FIG. 2. The six-pulse sequence is made of thirteen time intervals numbered illustratively as intervals 1-13. There are three pulse pairs with each pulse having a time duration of $\alpha$ which comprise time intervals 2, 4, 6, 8, 10 and 12. A time delay of $\tau$ between pulses comprises time intervals 3, 7, and 11. In a standard solid echo pulse pair this delay is set at one-half of the time intervals between pulse pairs (time intervals 1, 5, 9 and 13). The details of composite inversion pulses and time-suspension sequences are described in more detail, for example, in "Time Suspension Multiple Pulse Sequences: Application to Solid State Imaging", D. G.

Cory, J. B. Miller and A. N. Garroway, *Journal of Magnetic Resonance*, v. 90, p. 205 (1990), which article is hereby incorporated by reference.

FIG. 1A represents the RF pulses versus time in which each rectangle represents a separate RF pulse. The vertical axis represents the amplitude of the pulses which will be determined by various known factors. The relative phasing of the pulses is denoted by the notations, X, Y, etc. over each pulse. By convention, the applied fields are referenced to a Cartesian coordinate system with the applied Zeeman field pointing along the Z-axis. The applied RF fields are polarized 90° to the Zeeman field or along the X and Y axes. Since the X and Y axes are arbitrary directional designations, the pulse designations of X and Y are taken to represent relative phases of the RF field. For example a RF pulse designated as an X pulse has a relative phase shift of 90° with respect to an RF pulse designated as a Y pulse. Similarly, an RF pulse designated as X or −X has a relative phase shift of 180° with respect to an X pulse.

FIG. 1B schematically illustrates the pulsed gradient applied to the imaging sample to produce the image in which each rectangle represents an application of the gradient to the sample. The relative pulse timing with respect to the RF pulses is well-known and is schematically illustrated in the figure.

In accordance with my co-pending application the RF subcycle which is used between gradient pulses and/or the gradient pulses themselves are adjusted so that:
(1) the RF fields and the gradient fields do not overlap in time;
(2) the subcycles of RF modulation between gradient pulses are either cyclic or anti-cyclic (that is have propagators that equal +1 or −1);
(3) the subcycles of RF modulation between gradient pulses are dipolar decoupling to a second order approximation in the Magnus expansion of the average dipolar Hamiltonian; and
(4) the subcycles of RF modulation between gradient pulses are symmetric.

If these criteria are met (as is the case in FIGS. 1A and 1B), then the gradient interaction is decoupled from the line narrowing interaction for zero and odd ordered terms and for second order terms in the Magnus expansion.

Figure 3:
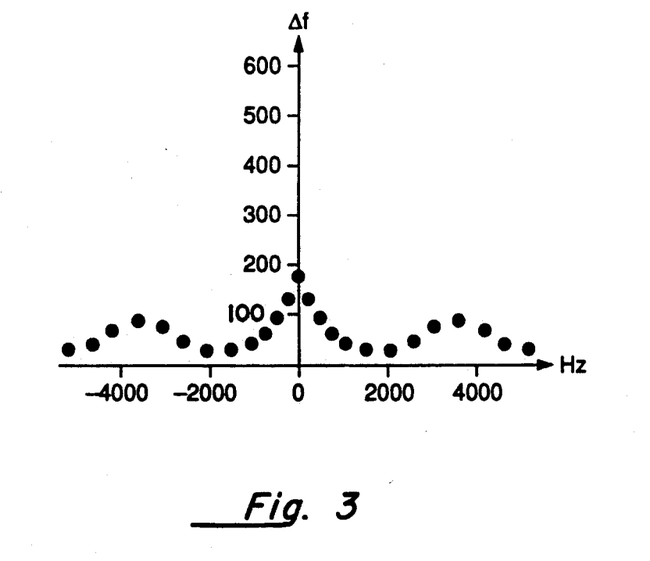
FIG. 3 is a graph of line width versus gradient strength for the experiment shown in FIGS. 1A-1B.

The remaining details of the experiment are conventional and are not discussed. The results of the experiment are shown in FIG. 3 which illustrates the change in line width over the width of a sample. The horizontal axis of FIG. 3 represents the gradient strength represented as frequency. The gradient frequency spread is plotted relative to the resonant frequency at 0 Hz. The vertical axis represents the line width also plotted in frequency.

Since the line width is directly related to the resolution of the image, with smaller line widths corresponding to higher resolution, FIG. 3 also represents the resolution across the sample. The sample material used to generate the graph illustrated in FIG. 3 is a type of poly-oxy-methylene plastic material sold under the tradename of DELRIN by Dupont DeNemours & Company.

An examination of FIG. 3 illustrates the fact that the line width, which ideally should be constant over the entire object, increases, and hence the resolution, decreases towards the outer edges of the sample due to the effects mentioned above.

Figure 4A:
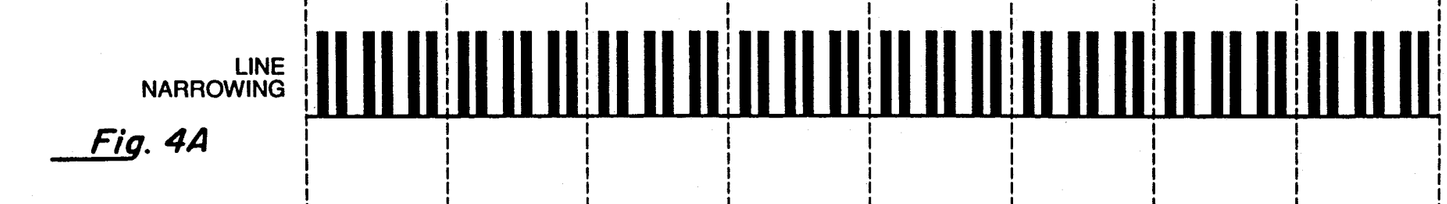
FIGS. 4A-4C are graphs of the RF line narrowing pulse sequence and pulsed gradient shown in FIGS. 1A-1B in which an additional phase toggle has been added in line 4C to illustrate the effects of second averaging.
Figure 4B:
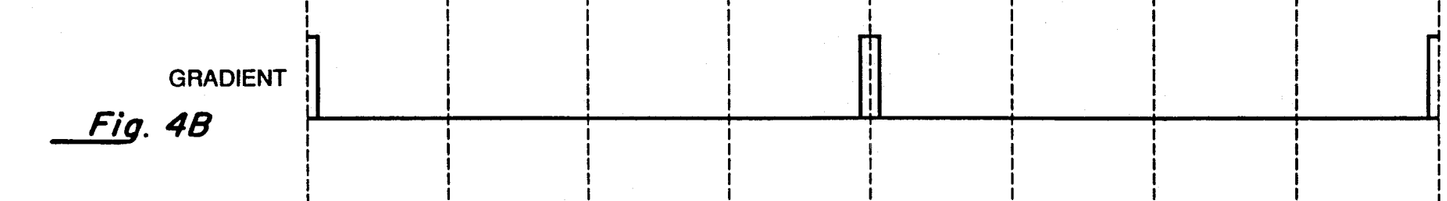
Figure 4C:
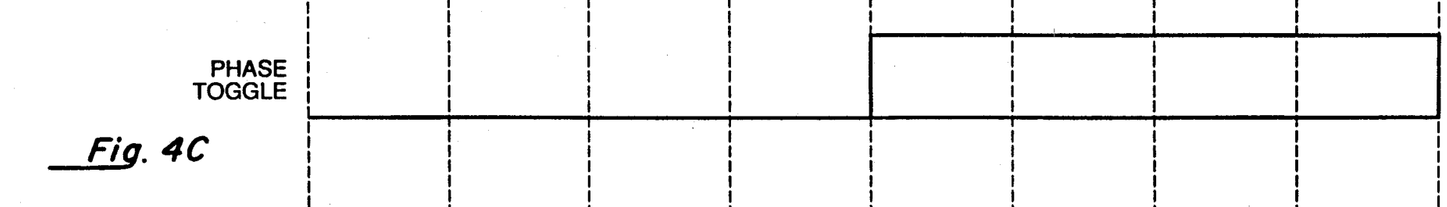

FIGS. 4A–4C illustrate a new experiment in which second averaging has been introduced. Second averaging can be introduced by phase shifts, extra RF pulses, frequency shifts, an offset in the main magnetic field, or the application of other external fields. In the experiment shown in FIGS. 4A–4C, a phase shift is used to cause second averaging In particular, FIG. 4C shows an additional phase increment which has been added to the last 24 pulses in the sequence so that the overall phase shift is the sum of the pulse phase shift plus the phase toggle.

Present day NMR spectrometers generate the basic RF energy from a direct digital synthesizer (DDS) that allows flexible control of both the phase and frequency of the RF energy. A second analog phase shifter, or quadrature multiplexer, is included in series with the output from the DDS. This latter quadrature multiplexer can very quickly and reproducibly switch the phase of the RF energy between four predetermined settings, thereby producing four quadrature channels from a single DDS setting. The quadrature multiplexer is used to generate the X, Y, −X and −Y phases shown above the RF pulses in FIG. 1A and the DDS can be used to generate the additional phase toggle shown in FIG. 4C.

Unfortunately, due to the residual problems related to second averaging, the resulting linewidth still has the same characteristics as the non-second-averaged experiment. More particularly, the graph of line width versus gradient strength for the experiment shown in FIGS. 4A–4C (shown in FIG. 5 for the same DELRIN material as used to generate FIG. 3) is essentially the same as that shown in FIG. 3.

Figure 6A:
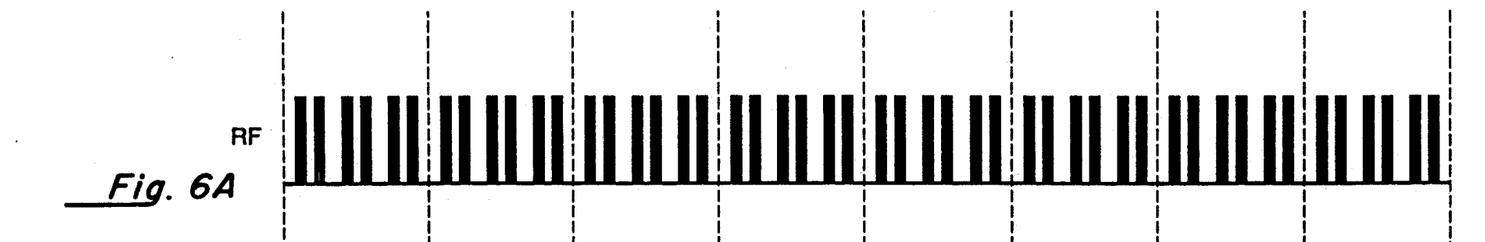
FIGS. 6A-6C are graphs of an RF line narrowing pulse sequence, pulsed gradient and improved phase toggle arranged in accordance with the present invention to improve the second averaging effect.
Figure 6B:
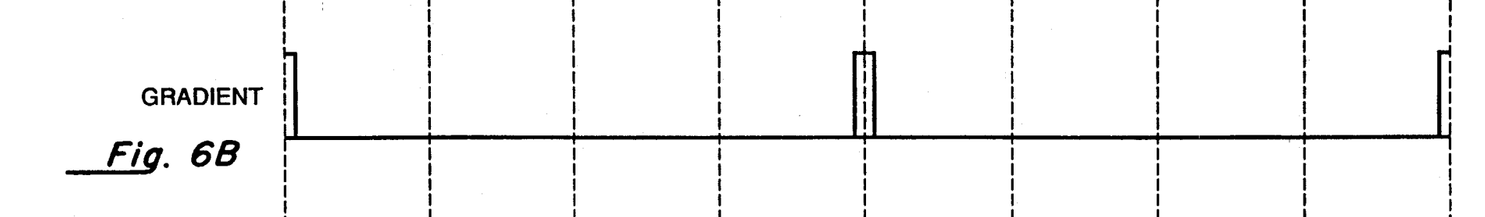
Figure 6C:
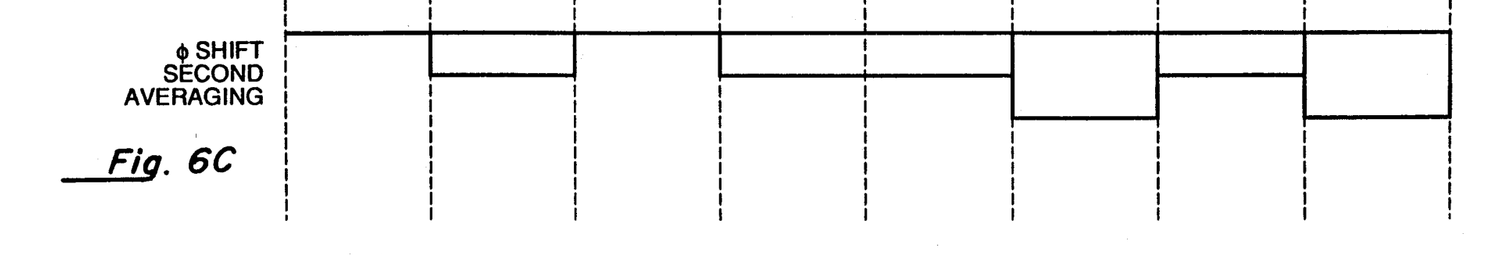

FIGS. 6A–6C illustrate another experiment in which second averaging has been introduced in accordance with the principles of the invention. In particular, FIG. 4C a new phase increment is used to time sequence the second averaging. The experiment is arranged in accordance with the following criteria:
1. The interaction of interest (the gradient interaction) is time dependent in that it vanishes for certain times;
2. the second averaging interaction is along the same axis as the interaction of interest; and
3. the second averaging interaction is present only when the interaction of interest is not.

Criteria (1) can be met for interactions that depend on external magnetic fields simply by the presence or absence of the field. Due to criteria (3), the two interactions are separated in time and, even when the sum of the actual resonance frequency and the second averaging frequency are zero, the spin dynamics are still modulated and a second averaging takes place.

In cases where the second averaging interaction introduces an unacceptable frequency offset, the second averaging can be further designed to introduce a multiple of $\pi/2$ phase offset during the time that the second averaging interaction is present. In this manner, the resulting data can be sampled in quadrature and the second averaging frequency eliminated from the data. More particularly, the data can be sampled as it is normally and the second averaging frequency removed by rearranging the data points of the two data channels that are acquired in quadrature by means of a well-known software procedure performed after the acquisition. In this case, the second averaging interaction is not observed in the results.

Figure 5:
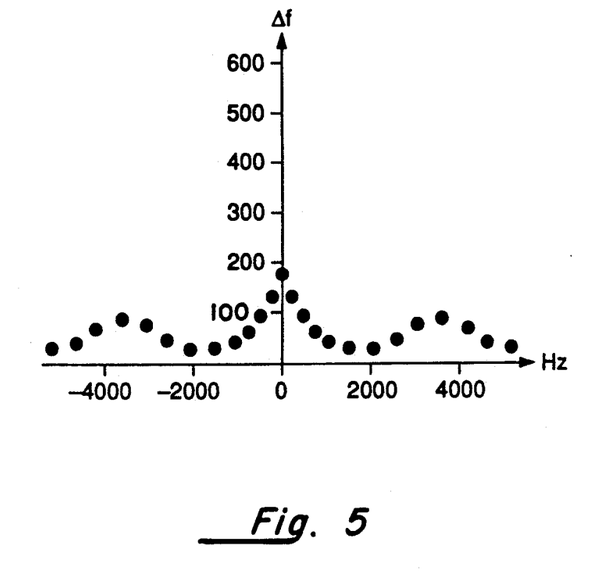
FIG. 5 is a graph of line width versus gradient strength for the experiment shown in FIGS. 4A-4C.
Figure 7:
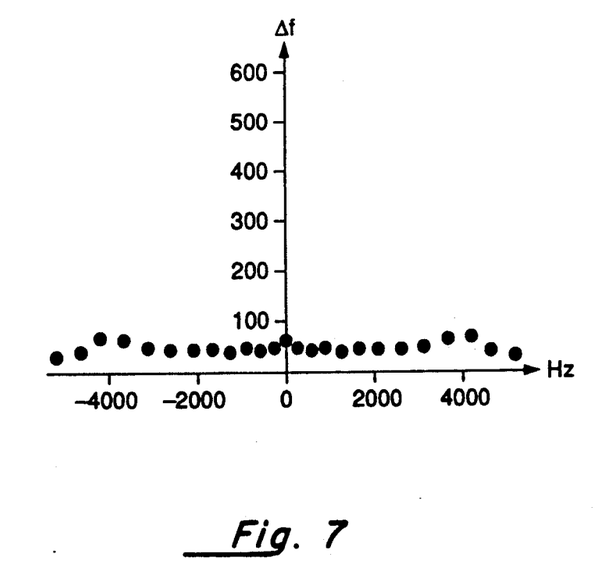
FIG. 7 is a graph of line width versus gradient strength for the experiment shown in FIGS. 6A-6C.

FIG. 7 is a plot of the line width versus gradient strength for a sample of DELRIN similar to that shown in FIGS. 3 and 5. A comparison of FIGS. 3, 5 and 7 indicates the improvement in resolution homogeneity.

Although only a few embodiments of the inventive decoupling method have been described, several modifications and changes will be immediately apparent to those skilled in the art.

What is claimed is:

1. In an NMR imaging experiment for obtaining spatial spin density data of nuclei in a solid object in which said nuclei are placed in a main magnetic field and excited with a radio frequency pulse, a gradient magnetic field having a spatial gradient is applied to said nuclei to introduce a gradient interaction with said nuclei, said nuclei are irradiated with at least one radio-frequency pulse sequence to introduce a line narrowing interaction with said nuclei, said pulse sequence being selected so that said gradient interaction and said line-narrowing interaction are decoupled, a method for improving image resolution comprising the steps of:
   A. controlling the application of said gradient magnetic field so that said gradient interaction vanishes for predetermined times;
   B. inducing a nutation in said nuclei to generate a spin rotation having an axis parallel to said gradient interaction to introduce a second averaging interaction; and
   C. controlling the nutation induced in step B so that said second averaging interaction is present only when said gradient interaction is not present.

2. In an NMR imaging experiment for obtaining spatial spin density data of nuclei in a solid object, the method according to claim 1 wherein step A comprises the step of:
   A1. applying a pulsed magnetic field composed of periodic gradient pulses.

3. In an NMR imaging experiment for obtaining spatial spin density data of nuclei in a solid object, the method according to claim 1 wherein step B comprises the step of:
   B1. applying a radio-frequency pulse sequence to said nuclei in which each pulse has a phase relative to the other pulses in said pulse sequence and in which said the relative phase periodically changes over time.

4. In an NMR imaging experiment for obtaining spatial spin density data of nuclei in a solid object, the method according to claim 1 wherein step C comprises the step of:
   C2. applying a radio-frequency pulse sequence to said nuclei in which each pulse has a phase relative to the other pulses in said pulse sequence and in which said the relative phase progressively changes over time.

5. In an NMR imaging experiment for obtaining spatial spin density data of nuclei in a solid object, the method according to claim 1 wherein step B comprises the step of:
   B2. applying a least one additional radio-frequency pulse to said nuclei during said radio-frequency pulse sequence.

6. In an NMR imaging experiment for obtaining spatial spin density data of nuclei in a solid object, the method according to claim 1 wherein said radio-frequency pulse sequence comprises a plurality of pulses, and step B comprises the step of:
   B3. changing the frequency of at least some of said plurality of pulses in said radio-frequency pulse sequence.

7. In an NMR imaging experiment for obtaining spatial spin density data of nuclei in a solid object, the method according to claim 1 wherein step B comprises the step of:
   B4. generating an offset in the main magnetic field.

8. In an NMR imaging experiment for obtaining spatial spin density data of nuclei in a solid object, the method according to claim 1 wherein step C comprises the step of:
   C2. controlling said second averaging interaction in such a manner that during the time that the second averaging interaction is present, it introduces a multiple of $\pi/2$ rotation in said nuclei.

9. In an NMR imaging experiment for obtaining spatial spin density data of nuclei in a solid object, the method according to claim 8 further comprising the steps of:
   D. sampling transverse magnetization generated by said nuclei to generate quadrature data signals; and
   E. processing said quadrature data signals to remove a second averaging frequency.

10. In an NMR imaging experiment for obtaining spatial spin density data of nuclei in a solid object in which said nuclei are placed in a magnetic field and excited with a radio frequency pulse, said nuclei are irradiated with at least one radio-frequency pulse sequence after said nuclei are excited, said pulse sequence being composed of a periodic sequence of pulse subcycles, each of said pulse subcycles having a scalar propagator, being symmetric and dipolar decoupling to at least the zero order of approximation, a pulsed magnetic field having a spatial gradient is applied to said nuclei to introduce a gradient interaction, said pulsed field having a plurality of gradient pulses intercalated between said pulse subcycles, and output magnetization is subsequently detected, a method for improving image resolution comprising the steps of:
   A. periodically inducing a nutation in said nuclei to generate a spin rotation having an axis parallel to said gradient interaction to introduce a second averaging interaction; and
   B. controlling the nutation induced in step B so that said second averaging interaction is present only when said gradient interaction is not present.

11. In an NMR imaging experiment for obtaining spatial spin density data of nuclei in a solid object, the method according to claim 10 wherein step A comprises the step of:
   A1. applying a radio-frequency pulse sequence to said nuclei in which each pulse has a phase relative to the other pulses in said pulse sequence and in which said the relative phase periodically changes over time.

12. In an NMR imaging experiment for obtaining spatial spin density data of nuclei in a solid object, the method according to claim 10 wherein step B comprises the step of:
   B1. applying a radio-frequency pulse sequence to said nuclei in which each pulse has a phase relative to the other pulses in said pulse sequence and in which said the relative phase progressively changes over time.

13. In an NMR imaging experiment for obtaining spatial spin density data of nuclei in a solid object, the method according to claim 10 wherein step A comprises the step of:

A2. applying a least one additional radio-frequency pulse to said nuclei during said radio-frequency pulse sequence.

14. In an NMR imaging experiment for obtaining spatial spin density data of nuclei in a solid object, the method according to claim 10 wherein said radio-frequency pulse sequence comprises a plurality of pulses, and step A comprises the step of:

A3. changing the frequency of at least some of said plurality of pulses in said radio-frequency pulse sequence.

15. In an NMR imaging experiment for obtaining spatial spin density data of nuclei in a solid object, the method according to claim 10 wherein step A comprises the step of:

A4. generating an offset in the main magnetic field.

16. In an NMR imaging experiment for obtaining spatial spin density data of nuclei in a solid object, the method according to claim 10 wherein step B comprises the step of:

B2. controlling said second averaging interaction in such a manner that during the time that the second averaging interaction is present, it introduces a multiple of $\pi/2$ rotation in said nuclei.

17. In an NMR imaging experiment for obtaining spatial spin density data of nuclei in a solid object, the method according to claim 16 further comprising the steps of:

C. sampling transverse magnetization generated by said nuclei to generate quadrature data signals; and D. processing said quadrature data signals to remove a second averaging frequency.

18. In an NMR experiment in which nuclei are placed in a magnetic field and excited with a radio frequency pulse and a cyclic and periodic multiple radio-frequency pulse sequence coupled with a time-dependent Hamiltonian of interest is applied to said nuclei, a method for producing a second averaging interaction, said method comprising the steps of:

A. periodically inducing a nutation in said nuclei to generate a second averaging spin rotation having an axis parallel to said Hamiltonian of interest; and B. controlling the nutation induced in step B so that a second averaging interaction produced by said spin rotation is separated in time from said Hamiltonian of interest.

* * * * *